(12) United States Patent
Powell (10) Patent No.: US 9,022,063 B2
(45) Date of Patent: May 5, 2015

(54) POWDER FEED RATE SENSOR

(75) Inventor: Ricky C. Powell, Ann Arbor, MI (US)

(73) Assignee: First Solar, Inc., Perrysburg, OH (US)

( * ) Notice: Subject to any disclaimer, the term of this patent is extended or adjusted under 35 U.S.C. 154(b) by 476 days.

(21) Appl. No.: 12/789,951

(22) Filed: May 28, 2010

(65) Prior Publication Data

US 2010/0304010 A1    Dec. 2, 2010

Related U.S. Application Data

(60) Provisional application No. 61/183,318, filed on Jun. 2, 2009.

(51) Int. Cl.
| | |
|---|---|
| *G01F 23/22* | (2006.01) |
| *G01F 1/30* | (2006.01) |
| *G01F 1/64* | (2006.01) |
| *G01F 1/66* | (2006.01) |

(52) U.S. Cl.
CPC .. *G01F 1/30* (2013.01); *G01F 1/64* (2013.01); *G01F 1/661* (2013.01); *G01F 1/666* (2013.01)

(58) Field of Classification Search
USPC ........... 73/61.75, 861, 861.21, 279, 280, 281; 222/161, 196, 200; 406/14, 15, 16, 17, 406/18, 34, 74, 10; 137/486
See application file for complete search history.

(56) References Cited

U.S. PATENT DOCUMENTS

| | | | | |
|---|---|---|---|---|
| 2,169,732 | A | * | 8/1939 | Legg ............................ 427/127 |
| 2,882,938 | A | * | 4/1959 | Kay .............................. 141/132 |
| 3,811,782 | A | | 5/1974 | Kerr |
| 4,656,663 | A | | 4/1987 | Jansson et al. |
| 5,074,149 | A | | 12/1991 | Stearns |
| 5,627,306 | A | | 5/1997 | Yamauchi et al. |
| 5,945,163 | A | | 8/1999 | Powell et al. |
| 6,561,005 | B2 | * | 5/2003 | Muller et al. ................... 73/1.74 |
| 6,725,514 | B2 | | 4/2004 | Moyer et al. |
| 7,267,002 | B2 | | 9/2007 | Itakura et al. |
| 7,323,885 | B2 | | 1/2008 | Gutendorf |
| 7,463,158 | B2 | * | 12/2008 | Hatch et al. ................... 340/627 |
| 7,481,913 | B2 | | 1/2009 | Kawase et al. |
| 2007/0007109 | A1 | | 1/2007 | Powell et al. |
| 2008/0282781 | A1 | * | 11/2008 | Hemblade .................... 73/61.75 |

FOREIGN PATENT DOCUMENTS

| | | |
|---|---|---|
| EP | 1 486 769 | 12/2004 |
| GB | 1187986 | 4/1970 |
| WO | WO 2007052022 A1 * | 5/2007 |

OTHER PUBLICATIONS

International Search Report and Written Opinion, International Application No. PCT/US2010/036568.

* cited by examiner

*Primary Examiner* — William McCalister

(74) *Attorney, Agent, or Firm* — Dickstein Shapiro LLP (57) ABSTRACT

A powder feed rate sensor includes a surface or diaphragm configured to detect powder feed rate.

9 Claims, 13 Drawing Sheets

POWDER FEED RATE SENSOR

CLAIM OF PRIORITY

This application claims priority to U.S. Provisional Patent Application No. 61/183,318, filed on Jun. 2, 2009, which is incorporated by reference in its entirety.

TECHNICAL FIELD

This invention relates to a powder feed rate sensor.

BACKGROUND

Powder feed or flow rate needs to be measured in many instances. Methods or apparatus have been developed, such as loss-in-weight method. However, accurate measurement method or apparatus with easy in-situ setup for production environment is still particularly desired.

DETAILED DESCRIPTION

In the semiconductor field, semiconductor solids are deposited on a substrate to allow for the formation of a semiconductor film. The semiconductor solid can be entrained in a carrier gas to allow for even deposition. Precisely controlling the feed rate of the solid allows the solid to be deposited uniformly to form very thin semiconductor films because input rates can influence or determine the film thickness. To avoid problems associated with pulsing, vibratory feeders, such as methods described in U.S. patent application Ser. No. 11/423,871 (incorporated by reference in its entirety), can be employed. A vibratory feeder can permit feeding of a solid at a precise rate.

To more accurately measure the powder feed rate, a sensor is developed with an in-situ setup. By directing the powder onto a surface, acoustic vibration pulses are generated by impacting particles. The acoustic signal is then detected by an appropriate sensor and converted to an electrical signal that can be amplified and processed. The signal can be correlated to powder feed rate to give an accurate measurement. The powder feed rate sensor can also include a feedback control module to read the sensor and adjust the powder feed rate. With an easy in-situ setup for production environment, this invention can be used to real time monitor the powder flow or feed rate in any suitable application or manufacturing process, such as powder feed vapor transport deposition or powder blending process. To increase the accuracy, the whole setup can include a sealing arrangement to provide vacuum measuring environment.

In one aspect, a method of measuring powder feed rate during a material deposition process can include directing powder toward a surface, generating acoustic vibration pulses caused by the powder contacting the surface, detecting the acoustic vibration pulses, converting the acoustic vibration pulses to an electrical signal, and measuring the electrical signal to determine the powder feed rate. The surface can be positioned at an oblique angle relative to the direction of the power. The surface can include a metal diaphragm. The metal diaphragm has a thickness range from about 25 micron to about 1000 micron. The step of detecting the acoustic vibration pulses can include using a sensor. The sensor can include a pressure transducer, a piezoelectric sensor or an acoustic microphone. The step of directing the powder can include dropping the powder onto the surface. The step of directing the powder can include directing the powder within a substantial vacuum.

In another aspect, a powder feed rate sensor with an in-situ configuration for vapor deposition can include a diaphragm, which, when powder is directed onto the diaphragm, emits acoustic vibration pulses caused by the powder contacting the surface, a sensor configured to detect the acoustic vibration pulses, a converter configured to convert the acoustic vibration pulses to an electrical signal, wherein the electrical signal can include a representation of the powder feed rate. The diaphragm can be positioned at an oblique angle relative to the direction of the powder. The diaphragm can include a metal diaphragm. The diaphragm can include a metal diaphragm with a thickness range from about 25 micron to about 1000 micron. The sensor can include a pressure transducer, a piezoelectric sensor or an acoustic microphone. The diaphragm can be contained inside a substantial vacuum. The sensor can further include a signal-amplifying module. The sensor can have sensitivity range from about 500 mV/psi (72.5 mV/kPa) to about 50,000 mV/psi (7,250 mV/kPa).

In another aspect, a closed loop powder feed rate control system for a material deposition system can include a powder source, a powder output conduit, and a powder feed rate sensor and control module, wherein the module is configured to control a rate of delivery of powder from the powder source based on the powder feed rate. The powder source can include a vibratory bowl. The powder feed rate control system can further include a diaphragm, which, when powder is directed onto the diaphragm emits acoustic vibration pulses caused by the powder contacting the diaphragm, a sensor configured to detect the acoustic vibration pulses, a converter configured to convert the acoustic vibration pulses to an electrical signal, wherein the electrical signal can include a representation of the powder feed rate, and a feed back control module reading the sensor and adjusting the powder feed rate.

The sensor and control module can include a parallel plate capacitor, configured to provide an electric field in a powder path, wherein the electric field is altered by the presence of powder directed along the powder path, causing a change to the capacitance, a sensor detecting the change of the capacitance and correlating the change to the powder feed rate, and a feed back control module reading the sensor and adjusting the powder feed rate. The sensor and control module can include a light source configured to direct light toward a powder path, a high speed camera configured to perform fast frame capture on powder directed along the powder path, a process module counting pixels with contrast against background on images resulting from the fast frame capture to correlate to powder feed rate, and a feed back control module reading the output of the process module and adjusting the powder feed rate. The sensor and control module can include a powder path, a current source, an electrode having an angled surface relative to the powder path, wherein the electrode is electrically connected to the current source, and held at an elevated potential, and configured to lose charge when powder is directed onto the angled surface and generate a current, an ammeter electrically connected to the current source and the electrode, configured to detect the current and correlate the current to the powder feed rate, and a feed back control module reading the ammeter and adjusting the powder feed rate.

The sensor and control module can include a light source configured to direct an incident light beam toward a powder path, wherein the beam is scattered by the presence of powder directed along the powder path, a scattered beam sensor configured to detect the scattered beam intensity, a process module read the scattered beam intensity from the scattered beam sensor to correlate to powder feed rate, and a feed back control module reading the output of the process module and adjusting the powder feed rate. The sensor and control module can include a powder exit chute, wherein powder is directed to the output conduit through a transparent section of the exit chute, forming a 1-grain thick layer on the transparent section, a light source configured to direct light toward the transparent section, wherein the transmitted light intensity can be made proportional to the powder feed rate, a sensor configured to detect the transmitted light intensity, a process module read the transmitted light intensity from the sensor to correlate to powder feed rate, and a feed back control module reading the output of the process module and adjusting the powder feed rate.

Figure 1:
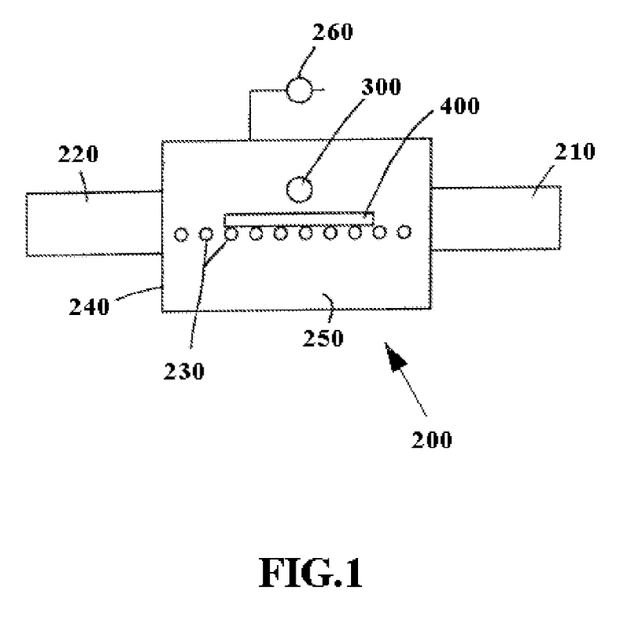
FIG. 1 is a drawing illustrating a system for depositing a semiconductor on a glass sheet substrate.

With reference to FIG. 1 of the drawings, a substrate processing system 200 includes distributor assembly 300. Both the distributor assembly 300 and the method for processing a substrate 400 are described and exemplified here.

With continuing reference to FIG. 1, the system 200 includes a housing 240 defining a processing chamber 250 in which a material is deposited on a substrate 400. Substrate 400 can be a glass sheet. Housing 240 includes an entry station 210 and an exit station 220. Entry station 210 and exit station 220 can be constructed as load locks or as slit seals through which substrate 400 enters and exits the processing chamber 250. The housing 240 can be heated in any suitable manner such that its processing chamber can be maintained at a deposition temperature. The distributor temperature can be about 500 degrees to about 1200 degrees C. Substrate 400 can be heated during the processing to a substrate temperature. The substrate temperature can be 200 degrees to 650 degree C. Substrate 400 can be transported by any appropriate means such as rollers 230, or a conveyor belt, preferably driven by an attached electric motor.

Figure 2:
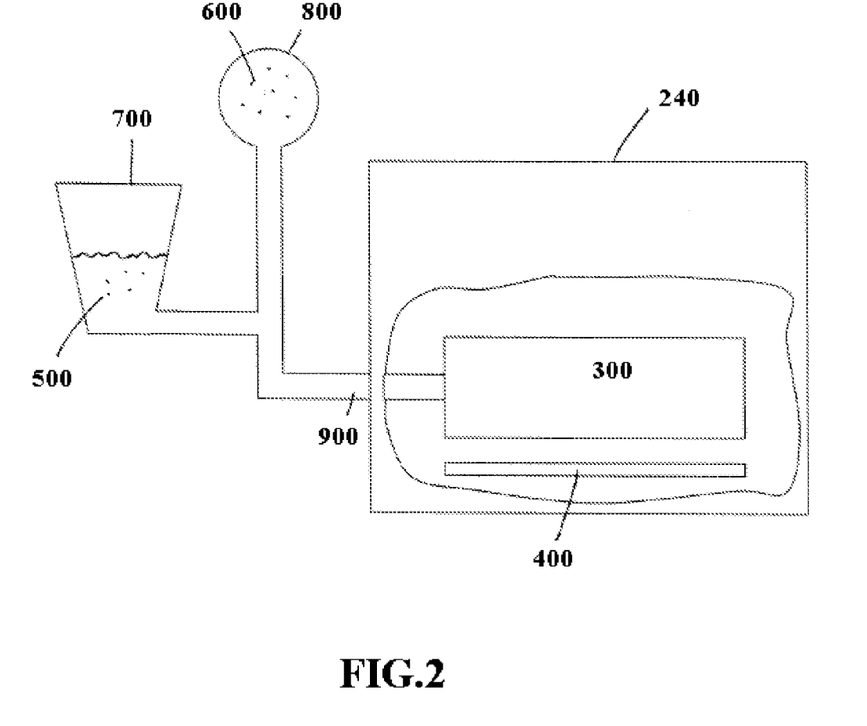
FIG. 2 is a drawing illustrating a material supply for introducing a semiconductor powder and a carrier gas into a distributor assembly.

With reference to FIG. 2, distributor assembly 300 contained in housing 240 is connected by feed tube 900 to a material supply, which can include a hopper 700 containing a powder 500 and a carrier gas source 800 containing an appropriate carrier gas 600. Powder 500 can contact carrier gas 600 in feed tube 900, and both carrier gas 600 and powder 500 are introduced into distributor assembly 300.

After carrier gas 600 and powder 500 are introduced into distributor assembly 300, powder 500 is vaporized and directed through distributor assembly 300 along with carrier gas 600 in such a manner that carrier gas 600 and the vapor are mixed to form a uniform vapor/carrier gas composition. The uniform vapor/carrier gas composition is then directed out of distributor assembly 300 toward substrate 400. The lower temperature of substrate 400 compared to the temperature in distributor assembly 300 in order to maintain the material in vapor phase, causes condensation of the vapor on a surface of substrate 400, and the deposition of a film, which has a substantially uniform thickness and a substantially uniform structure demonstrating a uniform crystallization and a substantial absence of particulate material, such as unvaporized powder.

The exit point of the semiconductor vapor from distributor assembly 300 can be spaced from substrate 400 at a distance in the range of about 0.5 to about 5.0 cm to provide more efficient deposition. While greater spacing can be utilized, that may require lower system pressures and would result in material waste due to overspraying. Furthermore, smaller spacing could cause problems due to thermal warpage of substrate 400 during conveyance in the proximity of the higher temperature distributor assembly 300. Substrate 400 can pass proximate to the point where the semiconductor vapor exists distributor assembly 300 at a speed of at least about 20 mm per second to about 40 mm per second.

In performing the deposition, successful results have been achieved using cadmium telluride and cadmium sulfide as the material. However, it should be appreciated that other materials can be utilized which include a transition metal (Group IIB) and a chalcogenide (Group VIA). It should be further appreciated that additional materials that can be utilized to form a semiconductor film have many useful applications (such as the manufacture of photovoltaic devices) and may be used with the systems and methods described herein. Also, dopants may be useful to enhance the deposition and properties of the resulting film.

Use of system 200 to perform the method has been performed with a vacuum drawn in the processing chamber 250 to about 0.5 to 760 Torr. In that connection, as illustrated in FIG. 1, the processing system 200 includes a suitable exhaust pump 260 for exhausting the processing chamber 250 of the housing 240 both initially and continuously thereafter to remove the carrier gas.

The carrier gas 600 supplied from the source 800 can be helium, which has been found to increase the glass temperature range and the pressure range that provide film characteristics such as deposition density and good bonding. Alternatively, the carrier gas can be another gas such as nitrogen, neon, argon or krypton, or combinations of these gases. It is also possible for the carrier gas to include an amount of a reactive gas such as oxygen that can advantageously affect growth properties of the material. A flow rate of 0.3 to 10 standard liters per minute of the carrier gas has been determined to be sufficient to provide the material flow to distributor assembly 300 for deposition on a substrate.

Figure 3:
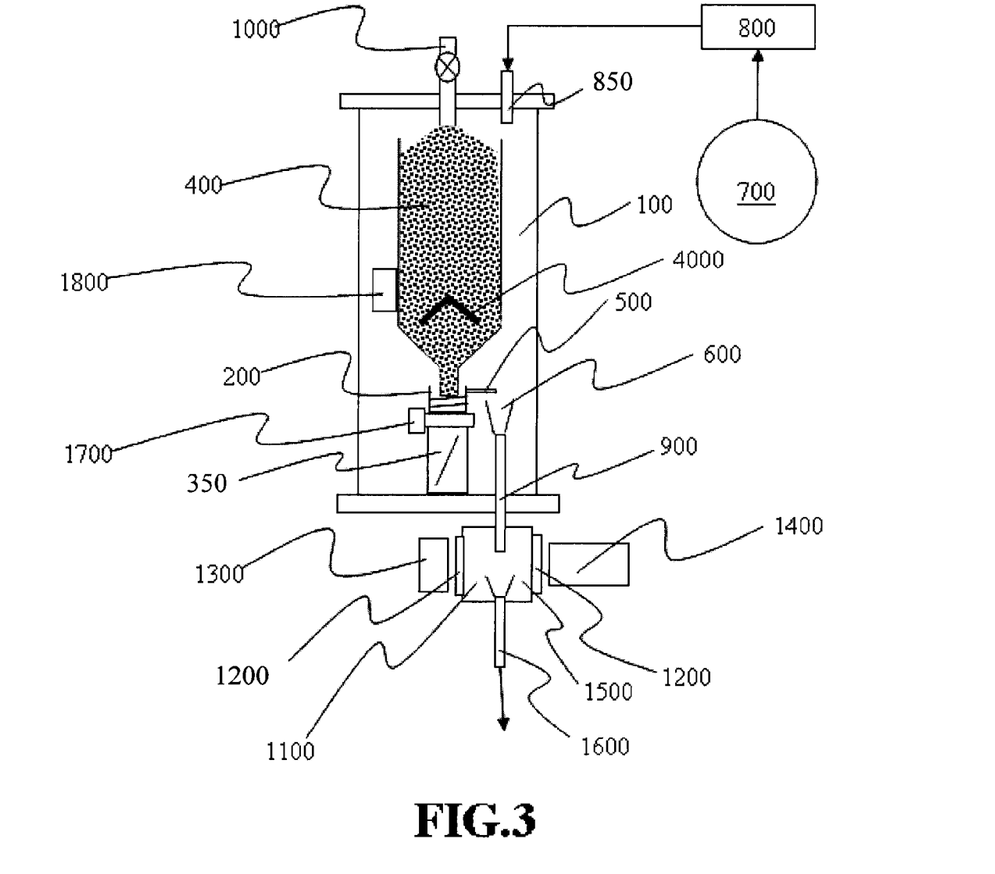
FIG. 3 is a drawing illustrating a vibratory feeder system.
Figure 4:
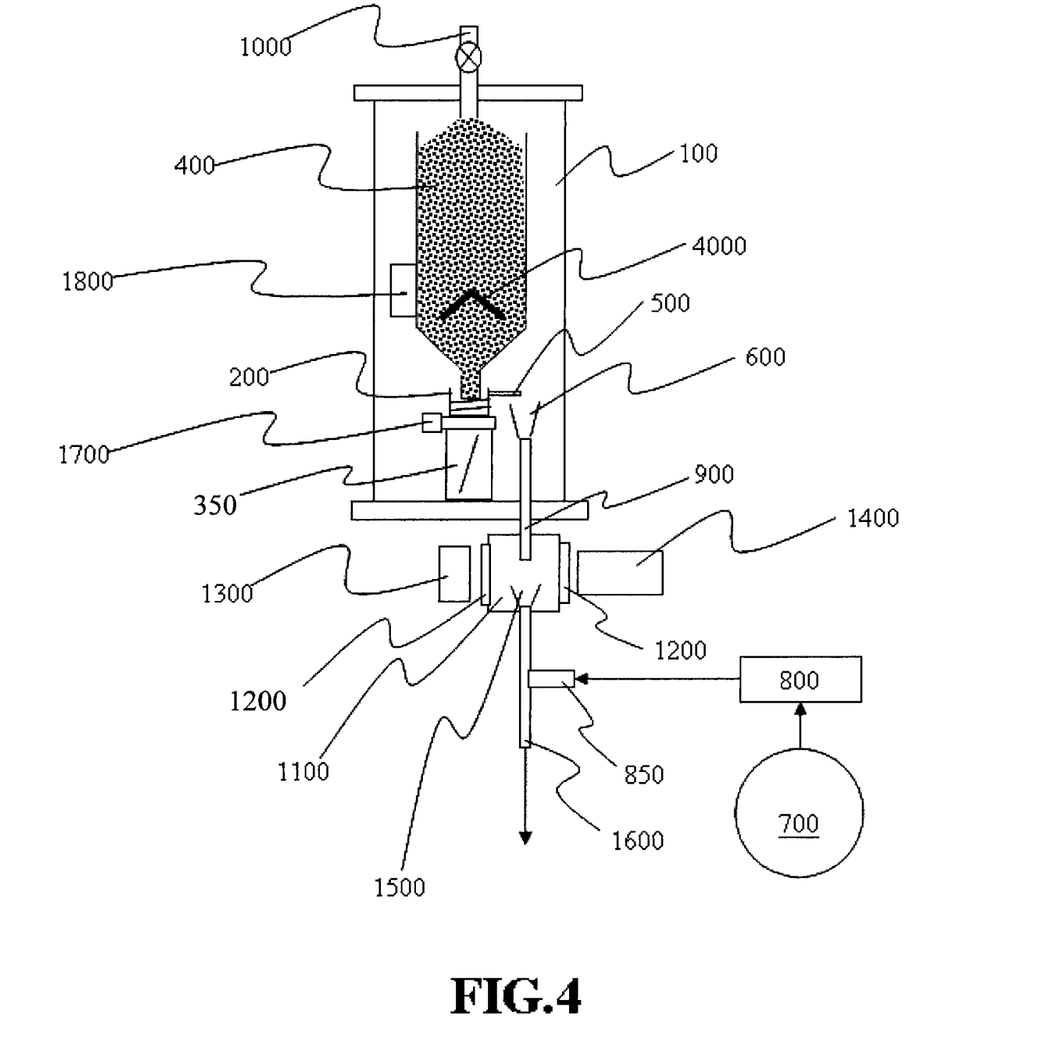
FIG. 4 is a drawing illustrating a vibratory feeder system.

Referring to FIGS. 3 and 4, a solid is contained within a hopper 400 located over a vibratory bowl 200. Hopper 400 can include a support baffle 4000 to support the weight of powder in hopper 400 and prevent packing of the solid in hopper 400. Vibratory bowl 200 can be spring mounted. The solid moves from hopper 400 into a supply reservoir (not shown) included in vibratory bowl 200. The solid can be divided into two portions: a return portion and an output portion. The return portion travels back into the supply reservoir (not shown) while the output portion exits vibratory bowl 200 into a processing system. The processing system can be a semiconductor coating system.

The solid can be a powder such as a semiconductor powder, for example, a transition metal (Group 12) and a chalcogenide (Group 18) such as cadmium sulfide or cadmium telluride. Powders can include a plurality of particles having average sizes in a range of, for example, 75 to 600 micrometers. Additional materials that can be utilized to form a semiconductor film may be used with these systems and methods. Dopants may also be useful to enhance the deposition and properties of the deposited product.

Vibratory bowl 200 and hopper 400 are contained within a vessel 100. Vessel 100 can be sealed so that a vacuum can be achieved within it. Vessel 100 can include a load valve 1000 which can allow for continuous operation of a vibratory feeder. The end of hopper 400 adjacent to vibratory bowl 200 can be shaped to direct the solid into a supply reservoir (not shown), for example, as a funnel or pipe. The movement of solid in hopper 400 is typically by the influence of gravity only but may be augmented by additional vibration. To prevent the solid from agglomerating, a hopper oscillator 1800 can be attached to hopper 400 which can vibrate hopper 400 intermittently with pulse sequences between 1 and 100 times per hour. The pulse sequences can include between 1 and 1000 individual pulses for example a short burst of vibrations from a solenoid operating at 1 to 150 Hz.

Referring to FIGS. 3 and 4, an accelerometer 1700 can be configured to monitor vibratory bowl 200 and to control the vibration amplitude in vibratory bowl 200 through a feedback system. Vibration excitation unit 350 can be driven with a variable frequency drive that accepts input from accelerometer 1700 such as a REO-VIB MFS-168 (http://www.reo-usa.com/products/mathand.html). Accelerometer 1700 and vibration excitation unit 350 can generate controlled vibrations with frequencies of greater than 10 Hz and less than 1000Hz, for example, frequencies of 20 Hz to 200 Hz. Vibration excitation unit 350 can include a solenoid. Commercially available excitation units can be utilized, for example, units from Calvibes or Texas Airsonics. Vibration frequencies can be adjusted to work near but not at the mechanical resonance of the system to avoid sensitivity of small changes in resonance frequency that can result from changes in mass loading due to variable fill height in the hopper.

Exit conduit assembly 500 of vibratory bowl 200 can be adjacent to a catch funnel 600 such that the output portion passes through exit conduit assembly 500 where it is collected by catch funnel 600. The output portion can pass through exit conduit assembly 500 at a rate of 0.1 to 50 grams/min. The solid proceeds through an output conduit 900 and into an observation cell 1100. Observation cell 1100 can be an optical observation cell. Observation cell 1100 can include windows 1200 to allow light from a light source 1300 to pass through observation cell 1100 to a camera attached to a vision system 1400 to monitor the solid within observation cell 1100. A vision based system in which pictures of the solid either moving in output conduit 900 prior to dropping into observation cell 1100 or dropping past a window 1200 of observation cell 1100 can be employed to determine the solid flow rate, as described for example, for JM Canty systems. The illumination for the vision system can be a strobe with a pulse frequency near the vibration excitation frequency. Inside observation cell 1100 is a collector funnel 1500 which is attached to an output 1600 to allow the solid to flow through and eventually be deposited on a substrate.

FIGS. 3 and 4 differ in the placement of a carrier gas inlet 850. In FIG. 3, carrier gas inlet 850 is a conduit connecting vessel 100 to carrier gas supply 700. The carrier gas can combine with the solid dropping into exit funnel 600. FIG. 4 depicts an alternate embodiment where output conduit 1600 includes carrier gas inlet 850. The carrier gas does not combine with the solid until after it has passed through observation cell 1100. As shown in FIGS. 3 and 4, a powder stream can be entrained in a carrier gas and move to a deposition system which can deposit the powder on a substrate. A gas supply 700 can be regulated by a carrier gas mass flow controller 800. A carrier gas such as, for example, helium which has been found to increase the glass temperature range and the pressure range that provide film characteristics such as deposition density and good bonding, can be introduced into vessel 100 through a carrier gas inlet 850. Alternatively, the carrier gas can be another gas such as nitrogen, neon, argon or krypton, or combinations of these gases. It is also possible for the carrier gas to include an amount of a reactive gas such as oxygen that can advantageously affect growth properties of the material. Carrier gas mass flow controller 800 can be an electronic mass flow controller. Carrier gas flow ranges can be from 0.1 to 50 slpm, for example 0.2 to 20 slpm, for feeding into vacuum sublimation processes. The present system could be capable of operation at almost any higher flow rate. For example, flows used in thermal spray systems of 60 to 3000 slpm are attainable.

The vibratory feeder can be part of a solid loading system. The loading system can reload the vibratory feeder, apply a vacuum, and allow for continuous operation of the vibratory feeder. Once a low powder condition is detected, the load hopper can be vented, reloaded, and evacuated, or solid can be pneumatically transferred into the load hopper. The powder can then be drained into the vibratory feeder.

Figure 5:
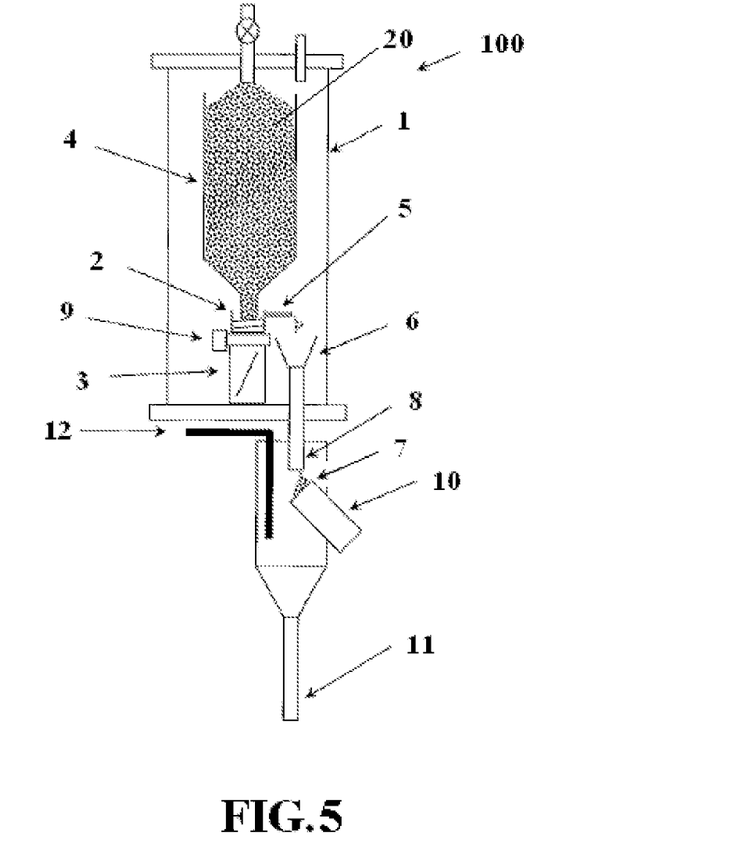
FIG. 5 illustrates a configuration of a powder feed rate sensor with an in-situ setup.

Referring to FIG. 5, powder feed rate sensor 10 can sense the rate of powder in a material deposition system. The material deposition system can be a vapor deposition system 100 and can include a powder source such as powder hopper 4 containing powder 20. Powder 20 can be contained in a vacuum containment vessel. Powder 20 can be flowed gravity dropped, or otherwise directed out of hopper 4. Powder 20 can be directed into vibration bowl 2. With vibration excitation unit 3, powder can be carried to exit chute 5 and dropped into catch funnel 6. The vibration magnitude can be measured by accelerometer 9. Powder can be directed through output conduit 8 or other powder source onto diaphragm 7 of powder feed rate sensor 10. Powder 20 contacting diaphragm can generate or otherwise cause acoustic vibration pulses. Diaphragm 7 can be angled at an angle relative to the path of powder 20 and the angle can be perpendicular to or oblique to the path of powder 20. Diaphragm 7 can be a diaphragm of acoustic sensor 10 or a separate thin metal diaphragm. The acoustic vibration pulses can be detected by sensor 10. The acoustic vibration pulses can be converted to an electrical signal and measured to determine the powder feed rate. Powder 20 can be carried by gas flow from carrier gas input 12 to powder output 11. For a possible embodiment, powder can be flowed, gravity dropped or otherwise directed from the vibration element in the powder feeder onto the diaphragm prior to entrainment in the carrier gas stream. The powder feeder can work in a partial vacuum with an appropriate sealing arrangement. The powder can also be directed onto the diaphragm.

The sensor 10 can be a pressure transducer, a piezoelectric sensor, or any suitable type of acoustic microphone that can offer the ability to measure low-level pressure or sound pressure levels. Piezoelectric sensors and pressure transducers have proven to be versatile tools for the measurement of various processes. They are used for quality assurance, process control and for research and development in many different industries.

Sensor 10 can include built-in signal conditioning microelectronics to produce clean, low-impedance voltage output signals, and can have sensitivity of in a range from about 500 mV/psi (72.5 mV/kPa) to about 1,000 mV/psi (145 mV/kPa), or from about 1,000 mV/psi (145 mV/kPa) to about 50,000 mV/psi (7,250 mV/kPa). Sensor 10 can include rugged, solid-state, all-welded stainless steel construction for use in environments unsuitable for standard microphones.

Sensor 10 can include a converter to convert the acoustic vibration pulses into electrical signals. The electrical signals can be transformed using any appropriate circuitry, hardware or software into powder feed rate data. The powder feed rate data can be displayed or otherwise presented in any suitable manner, such as displaying visually on a computer monitor.

Figure 6:
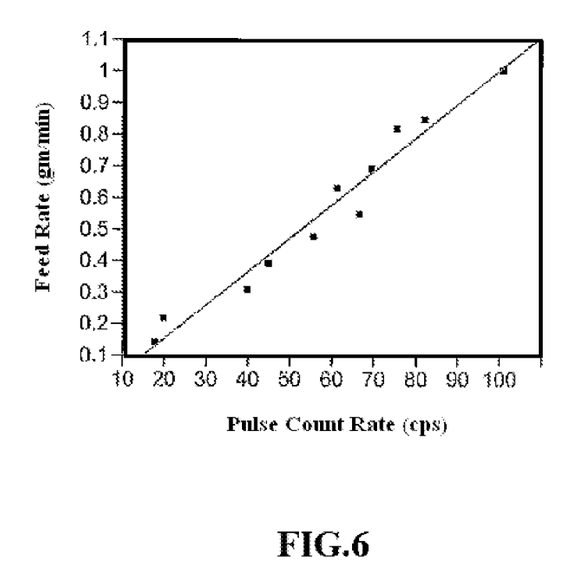
FIG. 6 is a diagram illustrating the correlation between CdS powder feed rate and pulse count rate.
Figure 7:
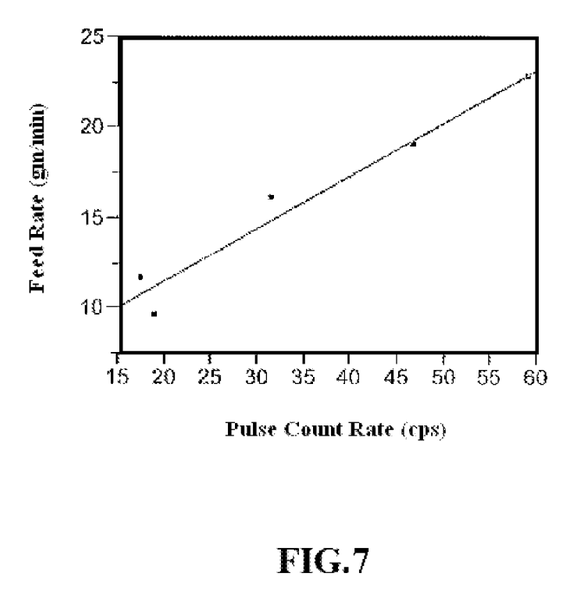
FIG. 7 is a diagram illustrating the correlation between CdTe powder feed rate and pulse count rate.

The acoustic impingement or impact energy transferred to sensor 10 can depend on powder's grain mass, grain velocity, and number of powder grains per minute. Referring to FIGS. 6 and 7, experiments have been done to test the correlation between feed rate of different kinds of powder and pulse count rate. FIG. 6 illustrates the bivariate fit of cadmium sulfide (CdS) powder feed rate and pulse count rate. It indicates that there is a clear linear relationship between predictor variable (pulse count rate) and response variable (cadmium sulfide powder feed rate). The linear regression model is:

Feed_Rate=−0.057436+0.0106071×Pulse_Count_Rate_CdS

The summary of bivariate fit is shown below:

| R_Square | 0.960317 |
|---|---|
| R_Squre Adj | 0.955907 |
| Root Mean Square Error | 0.05778 |
| Mean of Response | 0.549818 |
| Observations (Sum Wgts) | 11 |

From values of R_Square and R_Squre Adj, it shows the clear linear model can be established between the detected pulse count rate and cadmium sulfide powder feed rate.

FIG. 7 illustrates the bivariate fit of cadmium telluride (CdTe) powder feed rate and pulse count rate. It also indicates that there is a simply clear linear relationship between predictor variable (pulse count rate) and response variable (cadmium telluride powder feed rate). The linear regression model is:

Feed_Rate=5.6258266+0.2920338×Pulse_Count_Rate_CdTe

The summary of bivariate fit is shown below:

| R_Square | 0.955198 |
|---|---|
| R_Squre Adj | 0.940263 |
| Root Mean Square Error | 1.310619 |
| Mean of Response | 15.774 |
| Observations (Sum Wgts) | 5 |

From values of R_Square and R_Squre Adj, it also shows the clear linear model can be established between the detected pulse count rate and cadmium telluride powder feed rate. Together with the data and from FIG. 6 and statistical analysis, it conclusively indicates that the powder feed rate can be measured by the acoustic pulse count.

Pressure sensor 10 can have a sensitivity range from about 500 mV/psi (72.5 mV/kPa) to about 1,000 mV/psi (145 mV/kPa), or from about 1,000 mV/psi (145 mV/kPa) to about 50,000 mV/psi (7,250 mV/kPa). Sensor can have its own diaphragm. Diaphragm 7 can be stainless steel diaphragm. The thickness of diaphragm 7 can be in a range from 25 micron to 1000 micron.

Figure 8:
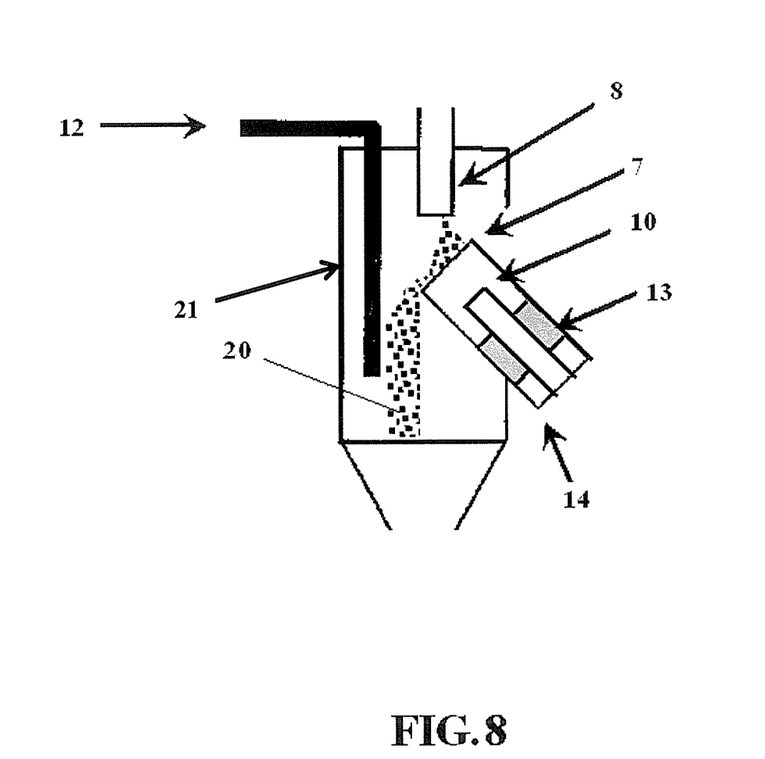
FIG. 8 is a close-in view of a configuration of a powder feed rate sensor with an angled diaphragm.

If diaphragm 7 of the sensor 10 or acoustic microphone is too thin to be robust enough to drop powder directly onto or if pressure sensor is not sensitive enough, a separate diaphragm can be included. Referring to FIG. 8, a configuration of a powder feed rate sensor 10 with an in-situ setup for in-line deposition process can include sensor 10 and separate diaphragm 7 in a chamber 21. Sensor 10 can be placed in enclosure or container 14 which can be a substantial vacuum having a substantially reduced pressure compared to atmospheric pressure. Fixture 13 can be included to help positioning and holding of sensor 10. Diaphragm 7 can be angled positioned to cover the upper end of enclosure or container 14. Fixture 13 can be foam, plastic clip, or any suitable fixture material. The thickness of separate diaphragm 7 can be in a range from 25 micron to 1000 micron.

Figure 9:
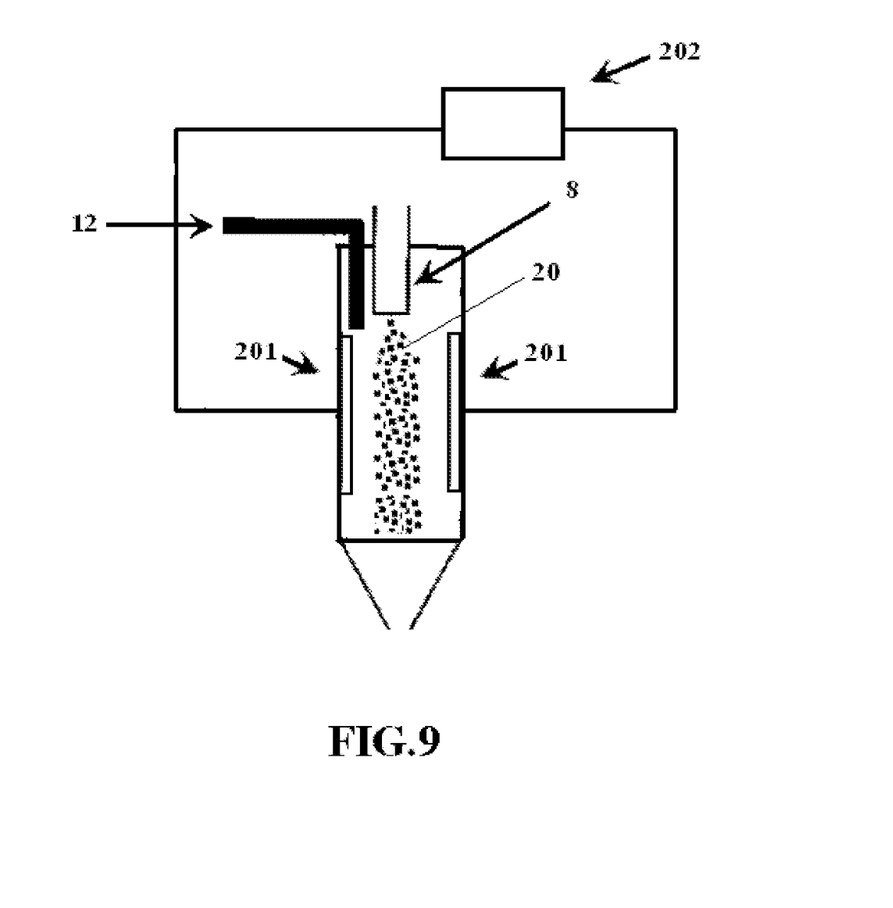
FIG. 9 is a close-in view of a configuration of a powder feed rate sensor with a parallel plate capacitor.

The powder feed rate sensor can include any appropriate sensor in addition to an acoustic sensor and any suitable circuitry, hardware, and software for converting sensor data into powder feed rate data. Referring to FIG. 9, a configuration of a powder feed rate sensor with an in-situ setup for in-line deposition process can include parallel plate capacitor 201 and measuring module 202. Generally, a capacitor can include two parallel conductive plates separated by a dielectric with permittivity $\in$. The plates are considered to extend uniformly over an area A and a charge density $\pm\rho=\pm Q/A$ exists on their surface. Assuming that the width of the plates is much greater than their separation d, the electric field near the centre of the device will be uniform with the magnitude $E=\rho/\in$. The voltage is defined as the line integral of the electric field between the plates:

$$V = \int_0^d E dz = \int_0^d \frac{\rho}{\varepsilon} dz = \frac{\rho \cdot d}{\varepsilon \cdot A}$$

$$C = \frac{\varepsilon \cdot A}{d}$$

The equation above reveals that capacitance is proportional to the permittivity, increases with area, and decreases with separation.

When powder 20 drops along a powder path between the plates of parallel plate capacitor 201, capacitance can be changed due to the volume fraction occupied by powder 10 and powder's different permittivity from the air. The change can be measured and real-time correlated to powder feed rate by measuring module 202.

Figure 10:
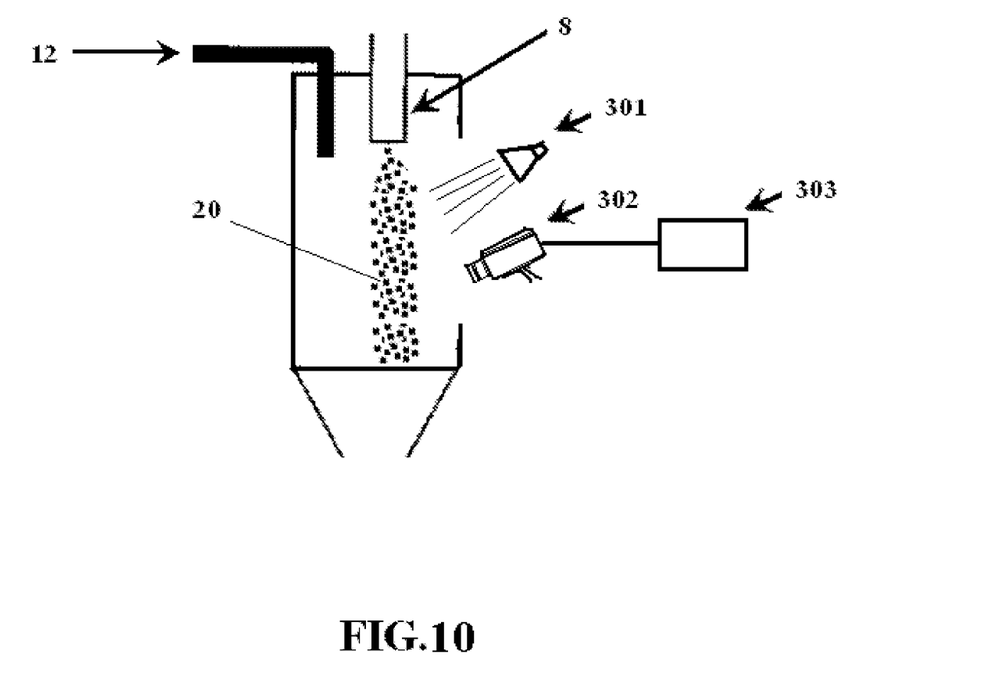
FIG. 10 is a close-in view of a configuration of a powder feed rate sensor with a light source and a high-speed camera.
Figure 11:
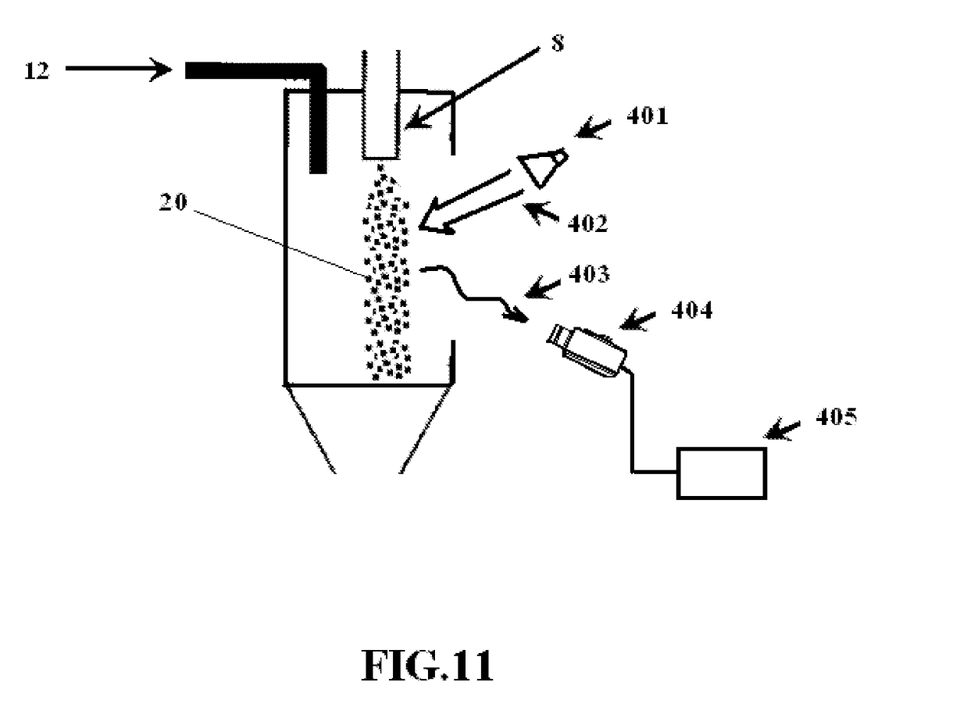
FIG. 11 is a close-in view of a configuration of a powder feed rate sensor with an incident light beam.

Referring to FIG. 10, a configuration of a powder feed rate sensor with an in-situ setup for in-line deposition process can include light source 301 directed at a powder path, high speed camera 302, and processing module 303. When powder 20 is directed along the powder path, high-speed camera 302 can be performing fast frame capture on the powder. The images from camera 302 can be processed such by processing module 303 which can real-time count pixels with contrast against background to correlate to powder feed rate. Referring to FIG. 11, a configuration of a powder feed rate sensor with an in-situ setup for in-line deposition process can include light source 401, beam sensor 404, and processing module 405. Incident light beam 402 can be generated by light source 401 and directed at powder 20 directed along a powder path. Beam sensor 404 can detect scattered beams 403. Scattered beams 403 can be forward or backward scattered. Processing module 405 can process measurement results to correlate to powder feed rate.

Figure 12:
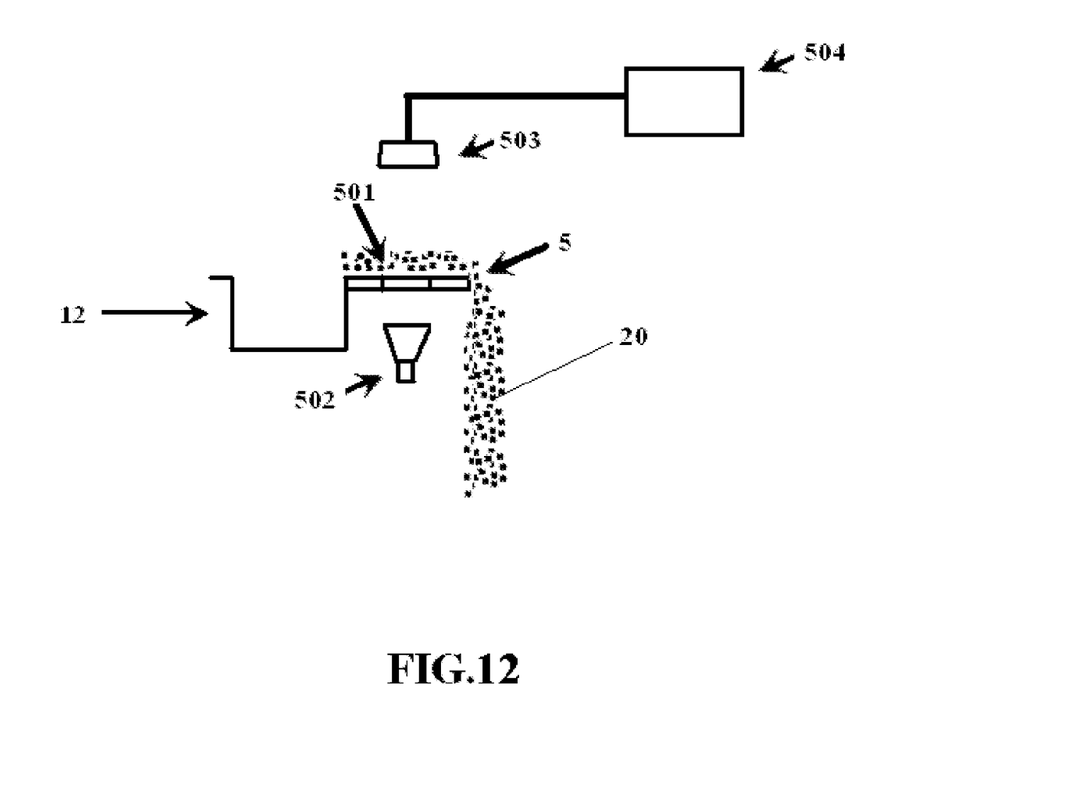
FIG. 12 is a close-in view of a configuration of a powder feed rate sensor with a light source and a sensor.

Referring to FIG. 12, a configuration of a powder feed rate sensor with an in-situ setup for in-line deposition process can include transparent section 501 of vibrating cup exit chute 5, light source 502, sensor 503, and processing module 504. When powder 20 is directed along the powder path, it can form a 1-grain thick layer on transparent section 501 of vibrating cup exit chute 5. The transmitted light intensity can be made proportional to the number of grains in the field of view (transparent section 501). Provided the feed rate of powder 20 on vibrating cup exit chute 5 is constant, the number of grains can be proportional to the feed rate. The transmitted light intensity can be detected by sensor 503. Processing module 504 can process measurement results to correlate to powder feed rate.

Figure 13:
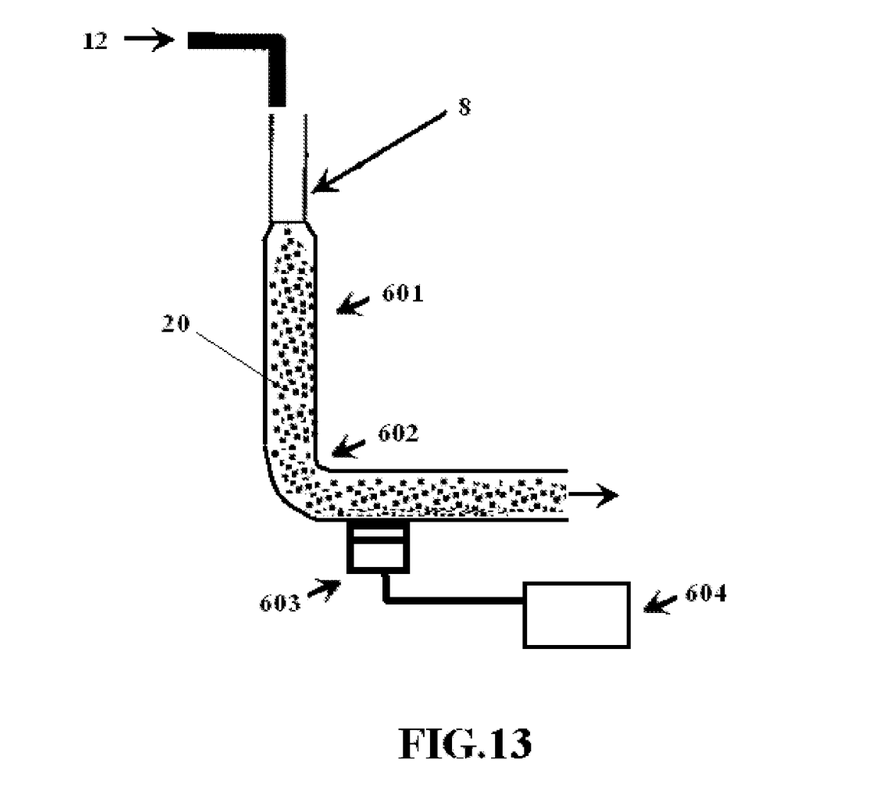
FIG. 13 is a close-in view of a configuration of a powder feed rate sensor with a light source and a sensor.

Referring to FIG. 13, a configuration of a powder feed rate sensor with an in-situ setup for in-line deposition process can include tube 601, acoustic sensor 603, and processing module 604. Acoustic sensor 603 can be attached to outside wall of tube 601. Powder 20 can be carried by gas flow from carrier gas input 12 through feed output 8 to tube 8. Tube 8 can have right angle bend 602 to ensure that the contact of gas-carried powder to the inner wall of tube 601 can generate the maximum signal. The signal will be proportional to the energy lost in powder contacting the tube wall. The signal intensity can be detected by acoustic sensor 603. Processing module 604 can process measurement results to correlate to powder feed rate.

Figure 14:
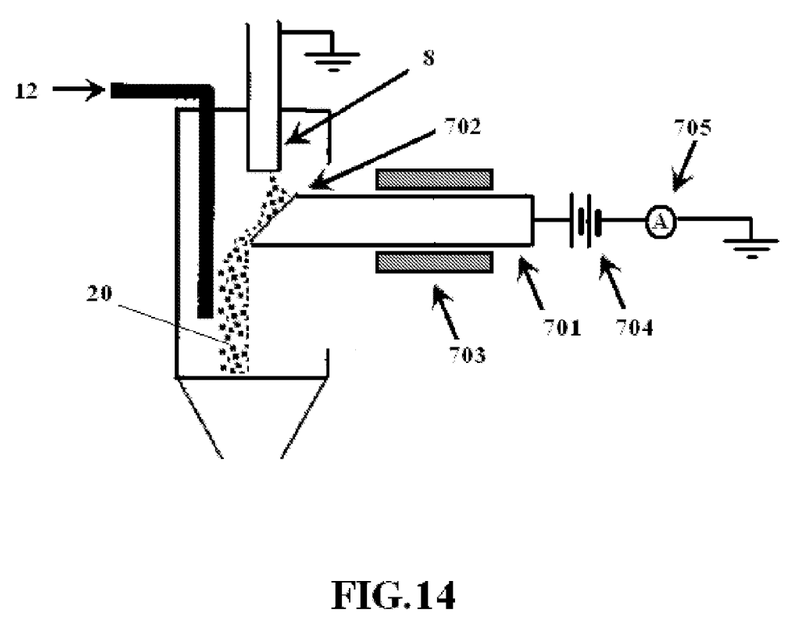
FIG. 14 is a close-in view of a configuration of a powder feed rate sensor with an ammeter.

Referring to FIG. 14, a configuration of a powder feed rate sensor with an in-situ setup for in-line deposition process can include electrode 701, current source 704, and ammeter 705. Electrode 701, current source 704, and ammeter 705 can be electrically connected. Electrode 701 can have a perpendicular or oblique angled surface 702, relative to the direction of the powder 20. Fixture 703 can be included to help positioning and holding of electrode 701. Fixture 703 can be foam, plastic clip, or any suitable non-conductive fixture material. Powder 20 can be flowed, gravity dropped or otherwise directed onto angled surface 702. Electrode can be held at an elevated potential. The neutral powder carry away some charge from electrode 701. Therefore, a current can be generated and is proportional to powder flow rate. The current can be detected by ammeter 705 and real-time correlated to powder feed rate.

Powder feed rate sensor with the easy in-situ setup described above can be a better option to develop a closed-loop control powder feed system.

In a closed-loop control powder feed system, a sensor monitors the powder feed rate and transmits the data to a control module that continuously adjusts the control input as necessary to keep the control error to a minimum. Feedback on how the system is actually performing allows the control module to dynamically compensate for disturbances to the powder feed system, such as changes in gas flow in the feed conduit, incoming powder grain mass or size. To reduce the complexity, the whole setup can include a proper sealing arrangement to provide vacuum measuring environment. The feedback system can include any suitable sensor include the sensors described above.

An ideal feedback control system cancels out all errors, effectively mitigating the effects of any forces that may or may not arise during operation and producing a response in the system that perfectly matches the user's wishes. Therefore, a closed loop powder feed rate control system with an in-situ setup for vapor deposition can be built with a diaphragm, a sensor, and a feed back control module. The powder can be gravity dropped onto the diaphragm and acoustic vibration pulses can be generated by impacting powder. The sensor can be positioned adjacent to the diaphragm detecting the acoustic vibration pulses, converting the acoustic vibration pulses to an electrical signal, and measuring the electrical signal to determine the powder feed rate. The feed back control module can be included to read the sensor and adjust the powder feed rate.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A closed loop powder feed rate control system for a material deposition system comprising:
   a powder source having a controllable powder feed rate;
   a powder output conduit configured to output powder from the powder source into a chamber, wherein the chamber comprises a gas inlet located in the chamber configured to introduce a carrier gas flow into the chamber;
   a container positioned at an oblique angle relative to the powder output conduit, with an upper end located at an angle within the chamber, the container including:
   a diaphragm located over the upper end of the container to receive powder directed onto the diaphragm from the conduit, the diaphragm emitting acoustic vibration pulses caused by the powder contacting the diaphragm, an acoustic sensor located within the container configured to detect the acoustic vibration pulses and convert the acoustic vibration pulses to an electrical signal, wherein the electrical signal is a representation of a powder feed rate, wherein after the powder contacts the diaphragm, it is entrained in the carrier gas flow and moved to a deposition system; and
   a powder feed rate control module configured to control a rate of delivery of powder from the powder source based on the electrical signal.

2. The powder feed rate control system of claim 1, wherein the powder source comprises a vibratory bowl.

3. The powder feed rate control system of claim 1, wherein the powder feed rate control module comprises:
   a feed back control module reading the electrical signal and adjusting the powder feed rate.

4. The powder feed rate control system of claim 2, wherein the vibratory bowl is contained within a sealed vessel.

5. The powder feed rate control system of claim 4, further comprising:
   a vacuum module configured to apply a vacuum to the sealed vessel.

6. The powder feed rate control system of claim 4, further comprising:
   a gas inlet connecting the sealed vessel to a carrier gas supply.

7. The powder feed rate control system of claim 1, wherein the acoustic sensor has a sensitivity range from about 500 mV/psi (72.5 mV/kPa) to about 50,000 mV/psi (7,250 mV/kPa).

8. The powder feed rate control system of claim 2, the powder feed rate control module further comprising:
   an accelerometer configured to monitor and control vibration amplitude in the vibratory bowl; and
   a vibration excitation unit configured to receive input from the accelerometer.

9. The powder feed rate control system of claim 2, wherein the powder source further comprises a hopper located above the vibratory bowl.

* * * * *